(12) United States Patent
Murray, Jr. et al.

(10) Patent No.: US 11,270,848 B2
(45) Date of Patent: Mar. 8, 2022

(54) VENTED CAPACITOR MOUNTING STRUCTURE FOR AIRBAG ELECTRONIC CONTROLLER UNIT

(71) Applicant: ZF ACTIVE SAFETY AND ELECTRONICS US LLC, Livonia, MI (US)

(72) Inventors: Neil G. Murray, Jr., Wixom, MI (US); Mark W. Ramsay, Livonia, MI (US)

(73) Assignee: ZF ACTIVE SAFETY AND ELECTRONICS US LLC, Livonia, MI (US)

( * ) Notice: Subject to any disclaimer, the term of this patent is extended or adjusted under 35 U.S.C. 154(b) by 0 days.

(21) Appl. No.: 16/507,702

(22) Filed: Jul. 10, 2019

(65) Prior Publication Data

US 2021/0012972 A1    Jan. 14, 2021

(51) Int. Cl.
| | |
|---|---|
| *H05K 1/18* | (2006.01) |
| *H01G 9/12* | (2006.01) |
| *H01G 9/008* | (2006.01) |
| *H01R 12/58* | (2011.01) |
| *H05K 5/00* | (2006.01) |
| *B60R 21/01* | (2006.01) |

(52) U.S. Cl.
CPC .............. *H01G 9/12* (2013.01); *H01G 9/008* (2013.01); *H01R 12/58* (2013.01); *H05K 1/184* (2013.01); *H05K 5/0034* (2013.01); *B60R 21/01* (2013.01); *B60R 2021/01286* (2013.01); *H05K 2201/10015* (2013.01); *H05K 2201/10378* (2013.01); *H05K 2201/10583* (2013.01); *H05K 2201/10651* (2013.01)

(58) Field of Classification Search
CPC . H01G 9/12; H01G 9/008; H01G 9/15; H01R 12/58; H05K 1/184; H05K 5/0034; H05K 2201/10015; H05K 2201/10378; H05K 2201/10583; H05K 2201/10651; B60R 21/01; B60R 2021/01286
See application file for complete search history.

(56) References Cited

U.S. PATENT DOCUMENTS 6,310,756 B1 * 10/2001 Miura .................. H01G 9/00
361/301.3
8,888,532 B2 * 11/2014 Hamaoka .......... H01R 13/6625
439/620.24

\* cited by examiner

*Primary Examiner* — James Wu
*Assistant Examiner* — Hung Q Dang
(74) *Attorney, Agent, or Firm* — Tarolli, Sundheim, Covell & Tummino LLP

(57) ABSTRACT

A mounting structure for mounting an electrolytic capacitor on a printed circuit board (PCB) of an airbag electronic control unit (ECU) includes a cap for receiving a lead end of the capacitor. The cap includes openings for receiving electrical leads of the capacitor. The cap supports electrical connectors, which electrically contact the electrical leads when a lead end of the capacitor is installed in the cap. The electrical connectors include portions for interfacing with the PCB to electrically connect the electrical connectors to the PCB. The cap also includes a vent that provides fluid communication from inside the cap to outside the cap. The vent is configured to vent dielectric liquids and gases discharged from the lead end of the capacitor during thermal cycles and/or charging cycles of the capacitor.

22 Claims, 5 Drawing Sheets

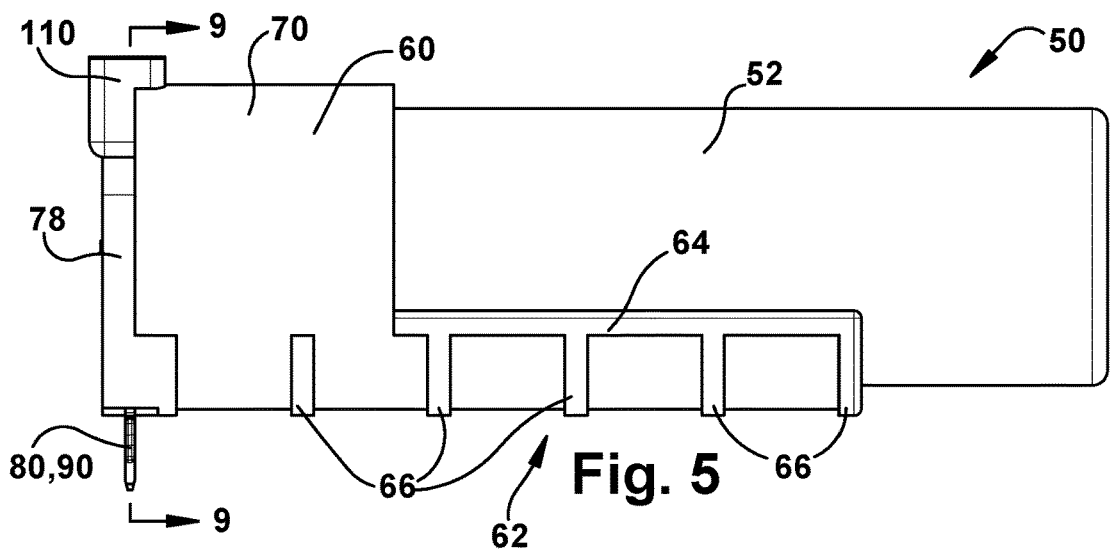
Fig. 5
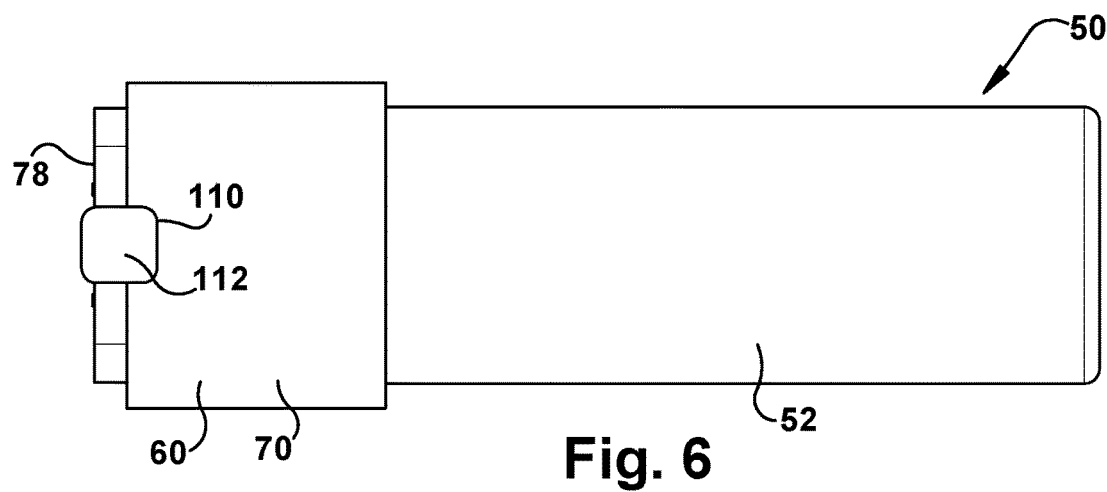
Fig. 6
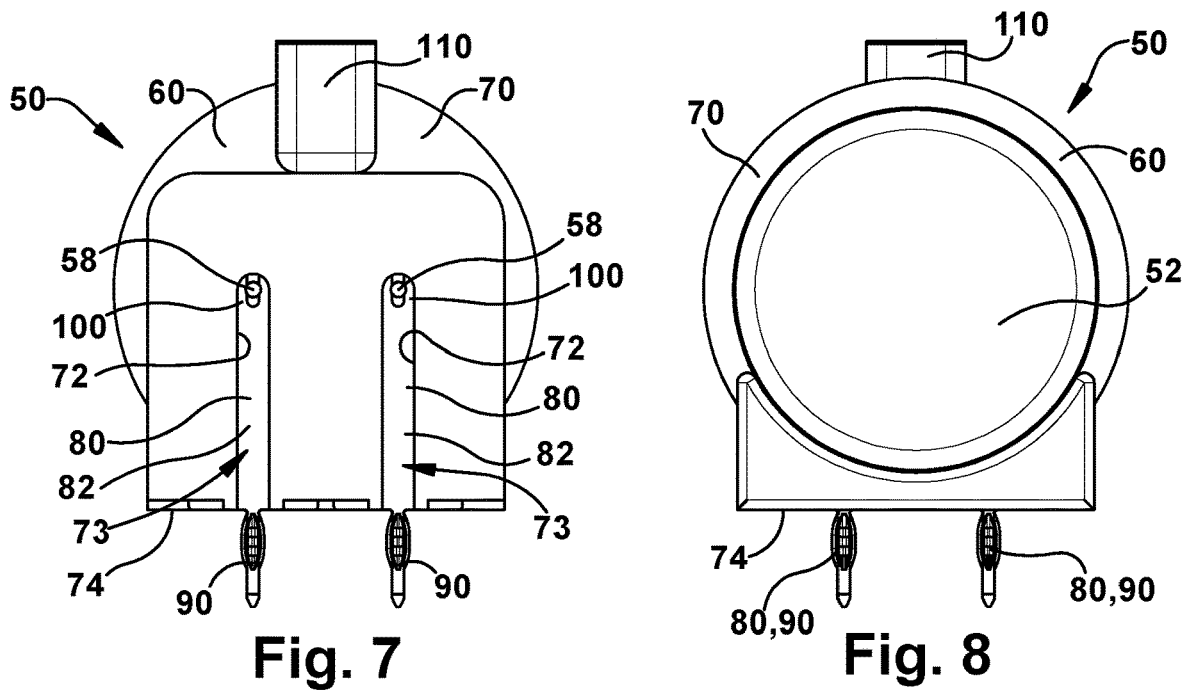
Fig. 7
Fig. 8

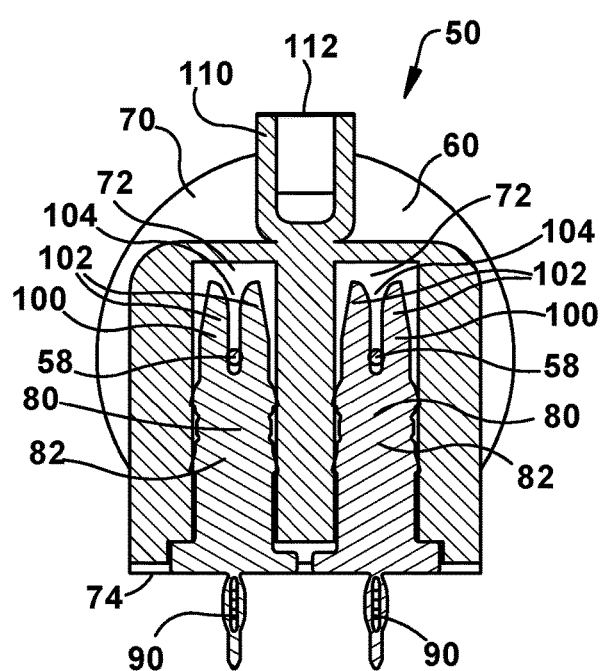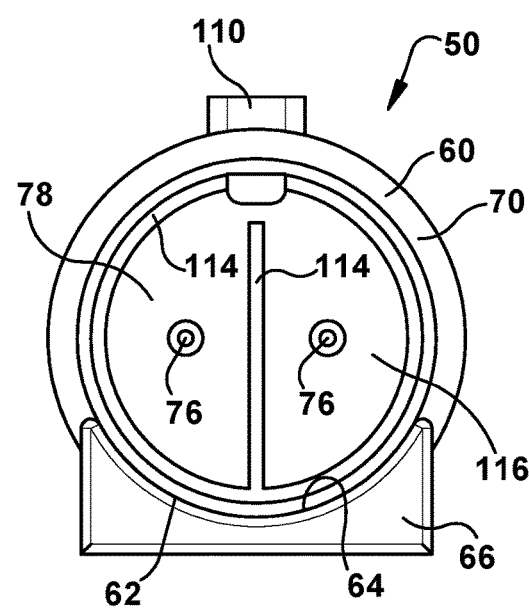

VENTED CAPACITOR MOUNTING STRUCTURE FOR AIRBAG ELECTRONIC CONTROLLER UNIT

TECHNICAL FIELD

This disclosure relates to a vehicle safety system including sensors for sensing vehicle conditions and a controller for receiving data from the sensors, determining whether a vehicle crash event has occurred based on the data, and actuating one or more vehicle occupant protection devices in response to that determination. More particularly, this disclosure relates to an airbag electronic controller unit (ECU) and, specifically, to a vented capacitor mounting structure for facilitating an overmolded ECU construction.

BACKGROUND

It is known to provide a vehicle safety system including one or more actuatable vehicle occupant protection devices, such as airbags, for helping to protect an occupant upon the occurrence of an event for which occupant protection is desired, such as a vehicle impact, a vehicle rollover, collectively referred to herein as a "vehicle crash." Such safety systems include an airbag ECU and crash sensors (e.g., accelerometers, pressure sensors, inertia sensors) positioned at various locations throughout the vehicle, such as the front, rear, sides, and center of gravity. The crash sensors are electrically connected (e.g., via wired connections or data/power bus connections) to the airbag ECU to provide data related to sensed vehicle conditions, which the airbag ECU uses to determine that a the type of crash that has occurred and which, if any, of the protection devices to actuate.

It can be desirable to construct an airbag ECU as a sealed device so as to protect the controller and its components from damage due to shock or moisture. To do so, it can be desirable to construct the airbag ECU as an overmolded component. In this configuration, the airbag ECU components are positioned in a mold and an overmold material, such as a plastic (e.g., nylon) is molded around the components. As a result, the airbag ECU components are sealed in the overmold material, which acts as a housing for the airbag ECU.

SUMMARY

According to one aspect, a mounting structure for mounting an electrolytic capacitor on a printed circuit board (PCB) of an airbag electronic control unit (ECU) includes a cap for receiving a lead end of the capacitor. The cap includes openings for receiving electrical leads of the capacitor. The cap supports electrical connectors, which electrically contact the electrical leads when a lead end of the capacitor is installed in the cap. The electrical connectors include portions for interfacing with the PCB to electrically connect the electrical connectors to the PCB. The cap also includes a vent that provides fluid communication from inside the cap to outside the cap. The vent is configured to vent dielectric liquids and gases discharged from the lead end of the capacitor during thermal cycles and/or charging cycles of the capacitor.

According to another aspect, alone or in combination with any other aspect, the cap can include a spacer for maintaining a space between the lead end of the capacitor and an end wall of the cap. The space can permit the dielectric liquids and gases to flow from the lead end of the capacitor to the vent.

According to another aspect, alone or in combination with any other aspect, the mounting structure can also include a cradle portion having a curved bed having a cylindrical configuration that mates with the cylindrical configuration of a body of the capacitor.

According to another aspect, alone or in combination with any other aspect, the mounting structure can also include a series of legs that project from a lower surface of the mounting structure and are configured to engage an upper surface of the PCB upon which the mounting structure is mounted.

According to another aspect, alone or in combination with any other aspect, the electrical connectors can include compliant pin connectors.

According to another aspect, alone or in combination with any other aspect, the electrical connectors can also include an upper end comprising lead receivers for receiving and connecting with the capacitor leads and an opposite, and a lower end comprising compliant pin connectors for being connected to plated-through holes.

According to another aspect, alone or in combination with any other aspect, the lead receivers can include spaced arms having a tapered configuration that define between them a lead receiving space that tapers from wide-to-narrow from top-to-bottom.

According to another aspect, alone or in combination with any other aspect, the cap can also include one or more slots for receiving the electrical connectors. The slots can be located in an end wall of the cap and extending generally parallel to the end wall. The cap can also include a lead opening associated with each lead of the capacitor. The lead openings can extend through the end wall and intersecting an associated slot. The cap can be configured so that the capacitor leads pass through the lead openings and engage the lead receivers in the slot when a lead end of the capacitor is installed in the cap.

According to another aspect, alone or in combination with any other aspect, an airbag ECU includes a PCB and electronic components mounted on the PCB. The mounting structure is mounted on the PCB. A capacitor is installed in the mounting structure. An overmold is molded around the PCB, electronic components, mounting structure, and the capacitor. The vent protrudes through the overmold and provides fluid communication between a lead end of the capacitor in the cap and the exterior of the airbag ECU. According to this aspect, the electrical connectors can be compliant pin connectors that protrude from the mounting structure and are received in plated-through holes on the PCB. The compliant pin connectors provide mechanical and electrical connection of the capacitor to the PCB.

BRIEF DESCRIPTION OF THE DRAWINGS

For a better understanding, reference may be made to the accompanying drawings, in which:

FIG. 5 is a top view of the vented capacitor mounting structure.

FIG. 6 is a side view of the vented capacitor mounting structure.

FIGS. 7 and 8 are opposite end views of the vented capacitor mounting structure.

FIG. 9 is a sectional view taken generally along line 9-9 of FIG. 5.

FIG. 10 is a sectional view taken generally along line 10-10 of FIG. 3.

DESCRIPTION OF EMBODIMENTS

The subject invention relates to a vehicle safety system generally and, more specifically to an airbag electronic control unit (ACU) of a vehicle safety system. A vehicle safety system can include one or more actuatable vehicle occupant protection devices, such as frontal airbags, side airbags, curtain air bags, knee bolster air bags, actuatable seatbelt pre-tensioners and/or retractors. The airbag ECU is operatively connected to these protection devices and is operative to control their actuation in response to vehicle conditions sensed via one or more sensors to which the airbag ECU is operatively connected. An example configuration for an airbag ECU is illustrated in FIG. 11.

Figure 11:
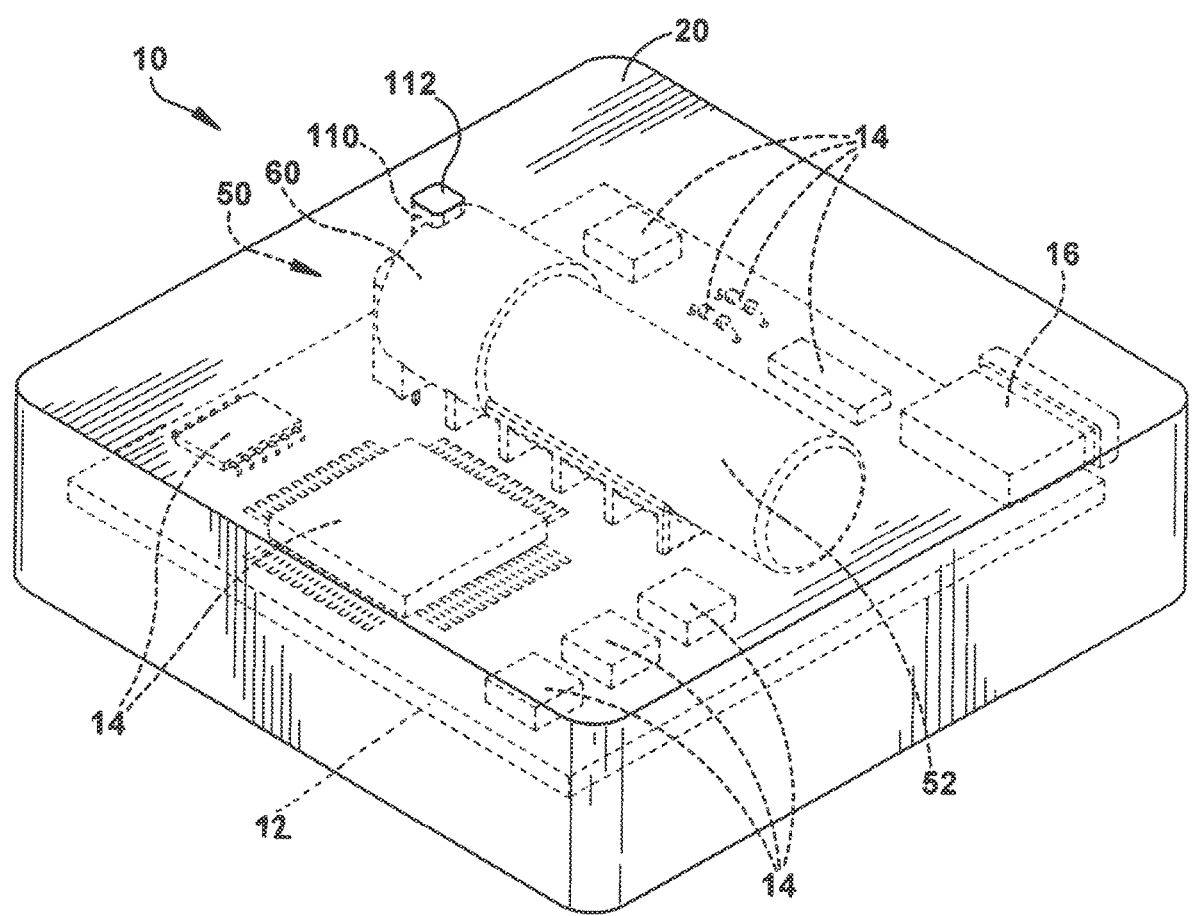
FIG. 11 is a perspective view illustrating an example implementation of the vented capacitor mounting structure of FIGS. 1-10.

Referring to FIG. 11, an airbag ECU 10 includes a printed circuit board (PCB) 12 upon which various electronic components 14 are mounted. The components 14 can, for example, include discrete components, such as resistors, capacitors, diodes, etc., or solid state components, such as controllers, memory modules (RAM, EEPROMs), etc. One or more external connectors 16, such as ports, provide connections with external wires and/or cables for providing power for operating the airbag ECU 10 and also for providing communication with external devices, such as crash sensors and protection devices. The PCB 12 and the components 14 mounted on the PCB are covered/encapsulated in an overmold 20, which forms a housing for the airbag ECU 10. The overmold 20 can be formed of a plastic or polymeric material, such as a nylon plastic material, that provides protection from shock and moisture.

In one example configuration, the overmold 20 can be formed by insert molding. In this configuration, the PCB 12 and the components 14 mounted thereon are placed in a cavity of a mold and the mold is closed. The mold is then filled, i.e., injected, with the molten plastic/polymer material. Once cooled, the mold is opened and the airbag ECU 10, with the overmold 20 applied, can be removed.

Among the components mounted on the PCB 12 is an energy storage device 50 that is used to power the airbag ECU 10 and serves as a reserve power supply in the event that external power is lost. This could be the case, for example, where vehicle battery power is lost due to a vehicle collision. The storage device 50 is illustrated in FIGS. 1-10.

Figure 1:
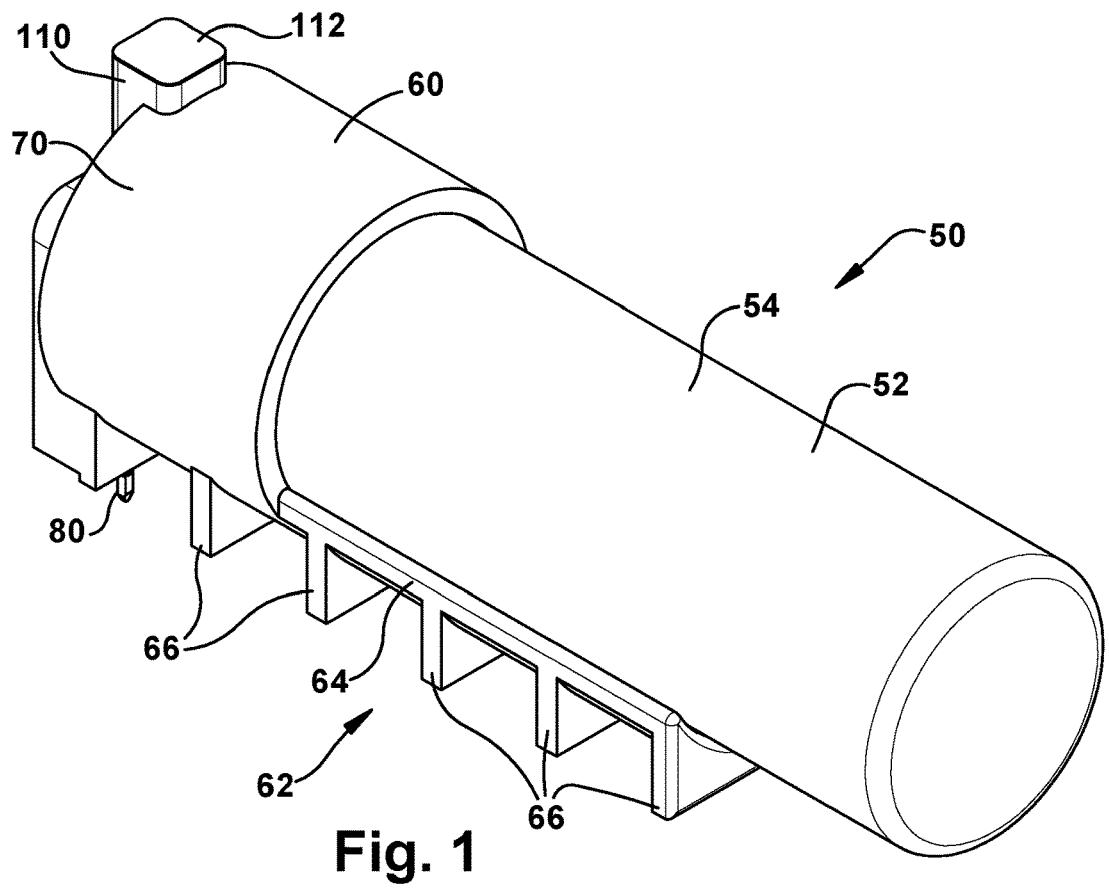
FIG. 1 is a perspective top view illustrating a vented capacitor mounting structure for facilitating an overmolded airbag ECU construction.
Figure 2:
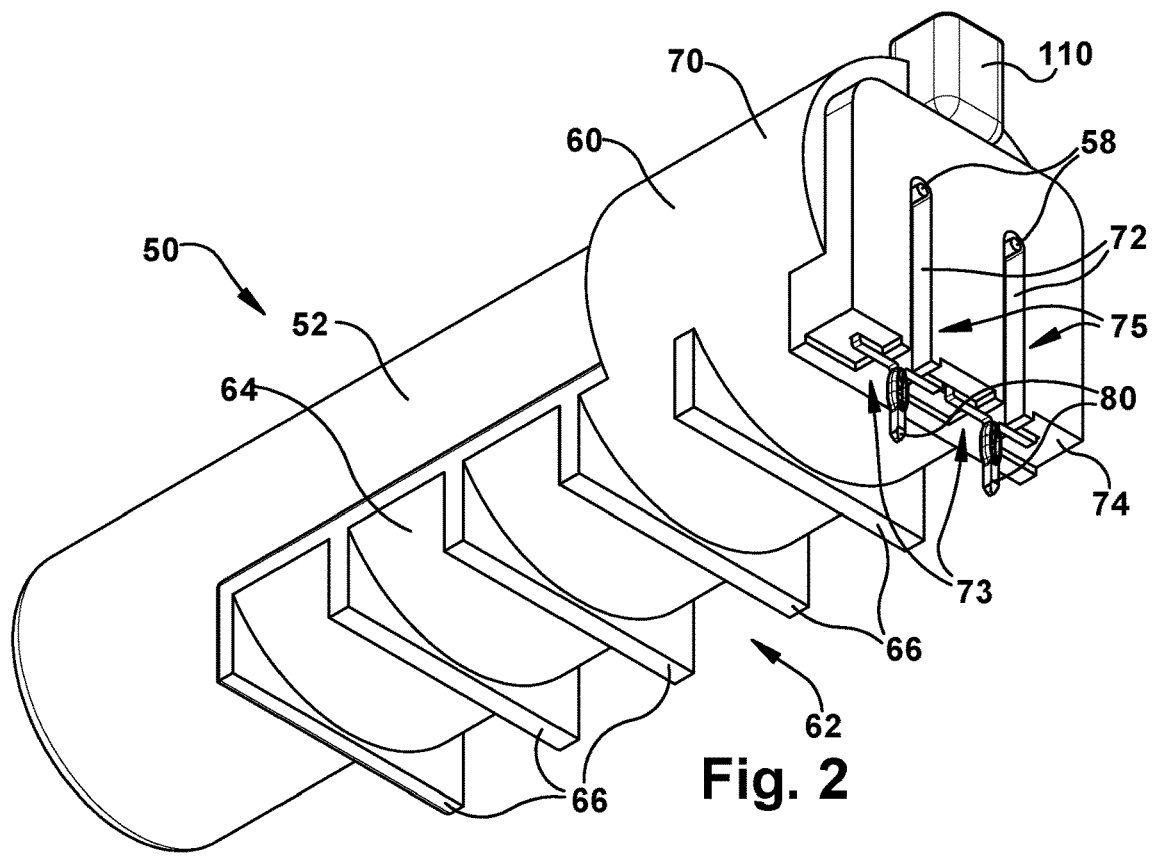
FIG. 2 is a perspective bottom view of the vented capacitor mounting structure.
Figure 3:
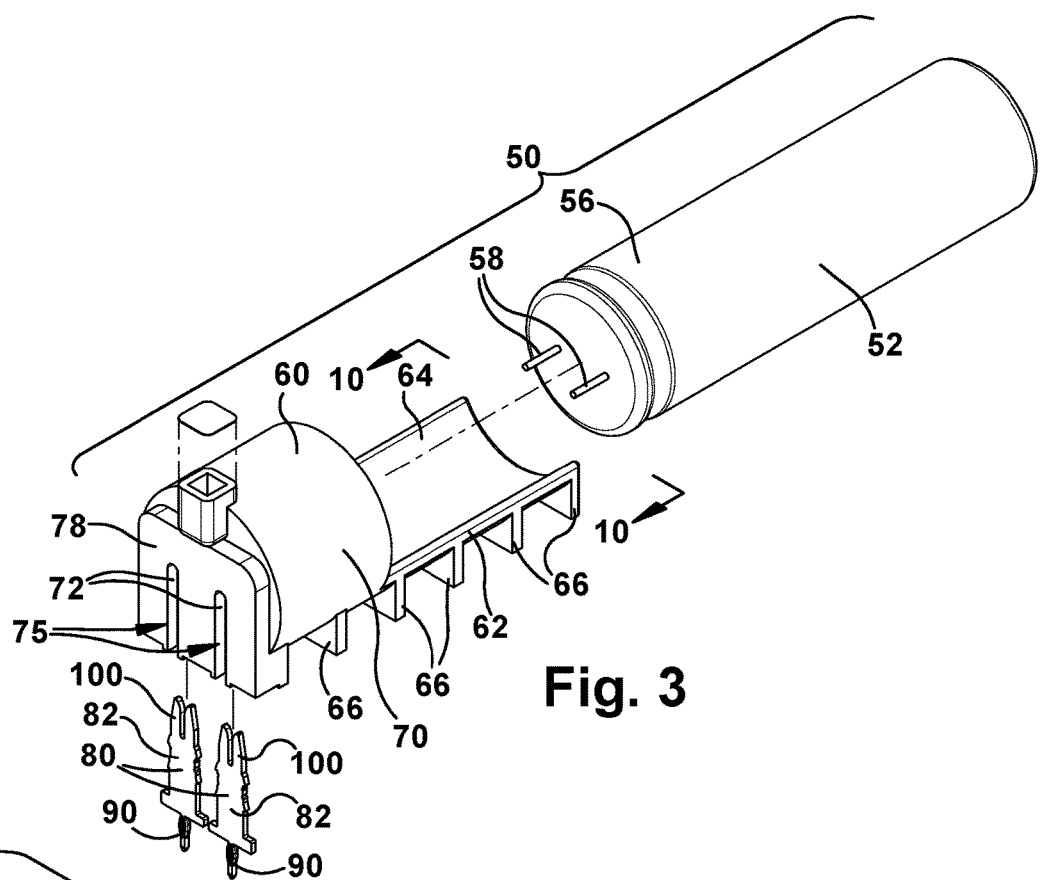
FIG. 3 is a perspective top exploded view of the vented capacitor mounting structure.
Figure 4:
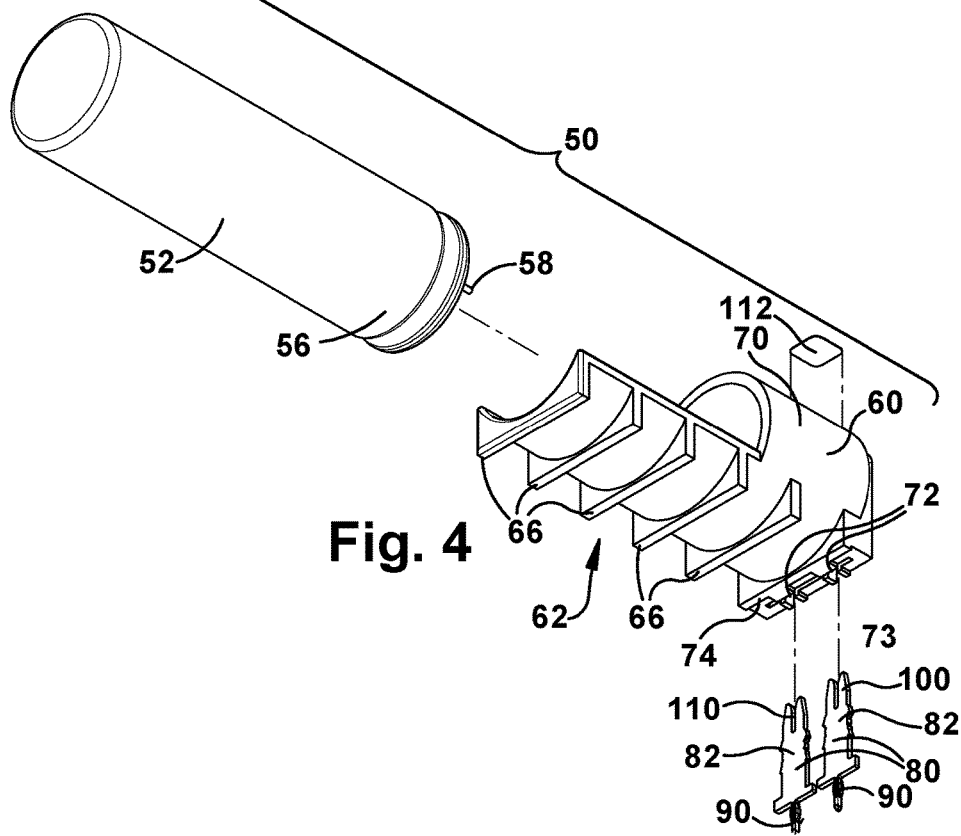
FIG. 4 is a perspective bottom exploded view of the vented capacitor mounting structure.

Referring to FIGS. 1-4, the storage device 50 includes a capacitor 52 and a mounting structure 60 for helping to facilitate mounting the storage device on the PCB 12 (see FIG. 1). The capacitor 52 can be an electrolytic capacitor, which can advantageously exhibit a comparatively large storage capacity.

The mounting structure 60 includes a cradle portion 62 having a curved bed 64 for receiving a body 54 of the capacitor 52 and a series of legs 64 that project from a lower surface of the bed. The bed 64 has a cylindrical curvature that matches with the cylindrical outer surface of the capacitor 52. The legs 64 have flat lower end surfaces configured to rest on the surface of the PCB 12 upon which the storage device 50 is mounted.

The mounting structure 60 also includes a cylindrical cap portion 70 into which a lead end 56 of the capacitor 52 (see FIGS. 3-4) is inserted. In the assembled condition of the storage device 50, the lead end 56 of the capacitor 52 is installed in the cap portion 70, and the cylindrical capacitor body 54 rests on the cylindrical surface of the bed 64 of the mounting structure cradle portion 62.

The cap portion 70 is configured to receive electrical connectors 80 for establishing an electrical connection between the capacitor 52 and the PCB 12 and the components 14 mounted thereon. In the example configuration illustrated in FIGS. 1-10, the electrical connectors 80 are compliant pin connectors. Alternative electrical connector configurations can be used.

The cap portion 70 includes a pair of spaced parallel slots 72 configured to receive the connectors 80. The slots 72 are formed in an end wall 78 of the cap 70 and extend generally parallel to the end wall. Lead holes 76 extend through the end wall 78 into the slots 72 and provide access from inside the cap 70 to the slots 72. In the example configuration illustrated in the figures, the slots 72 have a bottom opening 73 at a lower surface 74 of the cap 70 and also have a slotted portion 75 that extends at least partially along their respective lengths. The bottom openings 73 are configured and dimensioned to receive the electrical connectors 80. The slotted portions 75 are configured and dimensioned to provide visual indication of the engagement between the connectors 80 and their associated capacitor leads 58.

Each connector 80 has a central body portion 82 with a compliant pin 90 formed at a lower end and a capacitor pin receiver 100 at an opposite upper end. The connectors 80 slide into their respective slots 72, upper end first, such that the capacitor lead receivers 100 are positioned in the slots and the compliant pins 90 protrude from the slots. When the connectors 80 are installed in the cap portion 70, the compliant pins 90 extend from the lower surface 74 of the cap portion, which is coextensive with the lower end surfaces of the legs 64.

The capacitor lead receivers 100 include a pair of arms 102 (see FIG. 9) that are spaced apart, forming a receiver space 104 between the arms. The arms 102 have a tapered configuration such that the receiver space 104 is also tapered with the arms converging from top-to-bottom. In the assembled condition of the mounting structure 60, the connectors 80 are positioned within the slots 72 such that the capacitor pin receivers 100 are positioned adjacent the lead holes 76 in the cap portion 70. When the capacitor 52 is installed in the cap portion 70, the capacitor leads 58 extend through the lead holes 76 and pass through the slotted portions 75 of their associated slots 72.

To assemble the storage device 50, the capacitor 52 can be installed in the cap portion 70, with the leads 58 extending through their respective lead holes 76 and pass through their respective slots 72. The electrical connectors 80 can then be installed in their respective slots 72. As each electrical connectors 80 is installed, the capacitor lead receiver 100 encounters and engages the capacitor lead 58 in the slot 72. As the electrical connector 80 is advanced into the slot, the capacitor lead 58 enters the receiver space 104 between the arms 102. Further advancement of the connector 80 causes the arms 102 to converge on and engage the capacitor lead 58. Through this interaction, an interference can be established that connects the capacitor lead 58 to the electrical connector 80 through friction and/or material deformation.

Alternatively, to assemble the storage device 50, the electrical connectors 80 can be installed in their respective slots 72 first, and the capacitor 52 can then be installed in the cap portion 70. When the capacitor 52 is installed, the leads 58 will extend through their respective lead holes 76 and into their respective slots 72, where they will engage the capacitor lead receivers 100. As the capacitor 52 is pushed into the cap portion 70 and the leads 58 are urged into the receiver space 104 between the arms 102 of the lead receivers 100, the arms and/or the leads will deflect and or deform. As a result, an interference can be established that connects the capacitor lead 58 to the electrical connector 80 through friction and/or material deformation.

Once the capacitor 52 and both electrical connectors 80 are installed, the storage device 50 is ready for installation on the PCB 12. In this condition, the compliant pin connectors 90 protrude from the bottom surface 76 of the cap portion 70. Compliant pins are known structures commonly used to establish connections when received in plated-through holes of a structure, such as a PCB. The compliant pin connectors 90 include a pair of spaced apart, curved arms that have outer dimensions larger than the inside diameter of the plated-through holes in which they are received. Due to this interference, the spaced arms of the compliant pins 90 deflect as they are advanced into the plated-through PCB holes. This deflection causes the compliant pins 90 to exert an outward force on the plated-through hole, which connects the pins to the PCB both mechanically and electrically.

The compliant pin connectors 90 allow the storage device 50 to be installed onto the PCB 12 via a press-fitting of the compliant pins into the plated-through holes. The installation of the overmold 20 fortifies this connection and helps maintain the connection and position of the storage device 50 on the PCB 12.

Electrolytic capacitors such as those used for the capacitor 52 vent dielectric fluid and gas during power cycling and thermal cycling. Therefore, completely encapsulating the capacitor 52 in the overmold 20 would prevent this from occurring. Advantageously, the mounting structure 60 is configured to permit venting after the overmold 20 is applied. As best shown in FIGS. 1, 3, 10, 11, the cap 70 includes a vent 110 that projects upward (as viewed in the figures) from the end portion of the cap in a direction opposite the PCB 12. The vent 110 extends through the overmold 20 so that it is in fluid communication with the exterior of the airbag ECU 10. As shown, the vent 110 may include a membrane cover that permits venting while preventing moisture to ingress into the cap portion 70.

As shown in FIG. 10, the cap portion 70 can include a spacer 114 in the form of a rim or bead that projects from an end wall 116 of the cap portion. The spacer 114 is configured to engage the lead end 56 of the capacitor 52 and maintain an axial spacing of the lead end from the end wall 116. This spacing allows for the venting of dielectric fluid and gas from the capacitor 52 into the cap portion 70. The vent 110 allows this fluid and gas to escape into the atmosphere surrounding the airbag ECU 10. The vented electrolytic capacitor configuration of the storage device therefore allows for using an electrolytic capacitor in an implementation where the device, such as the airbag ECU 10 is encased in an overmold 20.

From the above description of the invention, those skilled in the art will perceive improvements, changes and modifications. For example, although the example configuration utilizes a cylindrical capacitor 62 and a mounting structure 60 with a correspondingly cylindrically surfaced cradle portion 62, the capacitor could have an alternative configuration, such as a flat, rectangular box-shaped configuration, and the configuration of the mounting structure could be adjusted accordingly. In this alternative example configuration, the interaction between the capacitor leads and the capacitor lead receivers, and also the venting through the cap can be similar or identical to that described above in regard to the illustrated example configuration. These and other such improvements, changes and modifications within the skill of the art are intended to be covered by the appended claims.

Having described the invention, the following is claimed:

1. A mounting structure for mounting an electrolytic capacitor on a printed circuit board (PCB) of an airbag electronic control unit (ECU), the mounting structure comprising:
   a cap for receiving a lead end of the capacitor, the cap comprising openings for receiving electrical leads of the capacitor; and
   electrical connectors supported by the cap and electrically contacting the electrical leads when the lead end of the capacitor is installed in the cap, the electrical connectors comprising portions for interfacing with the PCB to electrically connect the electrical connectors to the PCB,
   wherein the cap further comprises a vent that provides fluid communication from inside the cap to outside the cap, the vent being configured to vent dielectric liquids and gases discharged from the lead end of the capacitor during thermal cycles and/or charging cycles of the capacitor, and wherein the vent comprises a projection extending away from the electrical connectors.

2. The mounting structure recited in claim 1, wherein the cap comprises a spacer for maintaining a space between the lead end of the capacitor and an end wall of the cap, the space permitting the dielectric liquids and gases to flow from the lead end of the capacitor to the vent.

3. The mounting structure recited in claim 1, wherein the mounting structure further comprises a cradle portion having a curved bed having a cylindrical configuration that mates with a cylindrical configuration of a body of the capacitor.

4. The mounting structure recited in claim 1, wherein the mounting structure further comprises a series of legs that project from a lower surface of the mounting structure and are configured to engage an upper surface of the PCB upon which the mounting structure is mounted.

5. The mounting structure recited in claim 1, wherein the electrical connectors comprise compliant pin connectors.

6. The mounting structure recited in claim 1, wherein the electrical connectors comprise an upper end comprising lead receivers for receiving and connecting with the capacitor leads and an opposite, and a lower end comprising compliant pin connectors for being connected to plated-through holes.

7. The mounting structure recited in claim 6, wherein the lead receivers comprise spaced arms having a tapered configuration that define between them a lead receiving space that tapers from wide-to-narrow from top-to-bottom.

8. The mounting structure recited in claim 6, wherein the cap further comprises:
   one or more slots for receiving the electrical connectors, the slots being located in an end wall of the cap and extending generally parallel to the end wall; and
   a lead opening associated with each lead of the capacitor, the lead openings extending through the end wall and intersecting an associated slot, wherein the cap is configured so that the capacitor leads pass through the lead openings and engage the lead receivers in the slot when a lead end of the capacitor is installed in the cap.

9. An airbag ECU comprising:
the PCB;
electronic components mounted on the PCB;
the mounting structure of claim 1 mounted on the PCB;
the capacitor installed in the mounting structure; and
an overmold molded around and engaging the PCB, electronic components, mounting structure, and the capacitor, wherein the vent protrudes through the overmold and provides fluid communication between a lead end of the capacitor in the cap and the exterior of the airbag ECU.

10. The airbag ECU recited in claim 9, wherein the electrical connectors comprise compliant pin connectors that protrude from the mounting structure and are received in plated-through holes on the PCB, the compliant pin connectors providing mechanical and electrical connection of the capacitor to the PCB.

11. The airbag ECU recited in claim 9, wherein the overmold encapsulates the PCB, the electronic components, the mounting structure, and the capacitor.

12. An airbag ECU comprising:
the PCB;
electronic components mounted on the PCB;
the mounting structure of claim 1 mounted on the PCB;
the capacitor installed in the mounting structure; and
an overmold molded around and engaging the PCB, electronic components, mounting structure, and the capacitor, wherein the vent protrudes through the overmold and provides fluid communication between a lead end of the capacitor in the cap and the exterior of the airbag ECU.

13. The airbag ECU recited in claim 12, wherein the electrical connectors comprise compliant pin connectors that protrude from the mounting structure and are received in plated-through holes on the PCB, the compliant pin connectors providing mechanical and electrical connection of the capacitor to the PCB.

14. The airbag ECU recited in claim 12, wherein the overmold encapsulates the PCB, the electronic components, the mounting structure, and the capacitor.

15. A mounting structure for mounting an electrolytic capacitor on a printed circuit board (PCB) of an airbag electronic control unit (ECU), the mounting structure comprising:
a cap for receiving a lead end of the capacitor, the cap comprising openings for receiving electrical leads of the capacitor; and
electrical connectors supported by the cap and electrically contacting the electrical leads when the lead end of the capacitor is installed in the cap, the electrical connectors comprising portions for interfacing with the PCB to electrically connect the electrical connectors to the PCB,
wherein the cap further comprises a vent that provides fluid communication from inside the cap to outside the cap, the vent being configured to vent dielectric liquids and gases discharged from the lead end of the capacitor during thermal cycles and/or charging cycles of the capacitor, and wherein the vent extends perpendicular to a longitudinal centerline of the capacitor.

16. The mounting structure recited in claim 15, wherein the cap comprises a spacer for maintaining a space between the lead end of the capacitor and an end wall of the cap, the space permitting the dielectric liquids and gases to flow from the lead end of the capacitor to the vent.

17. The mounting structure recited in claim 15, wherein the mounting structure further comprises a cradle portion having a curved bed having a cylindrical configuration that mates with a cylindrical configuration of a body of the capacitor.

18. The mounting structure recited in claim 15, wherein the mounting structure further comprises a series of legs that project from a lower surface of the mounting structure and are configured to engage an upper surface of the PCB upon which the mounting structure is mounted.

19. The mounting structure recited in claim 15, wherein the electrical connectors comprise compliant pin connectors.

20. The mounting structure recited in claim 15, wherein the electrical connectors comprise an upper end comprising lead receivers for receiving and connecting with the capacitor leads and an opposite, and a lower end comprising compliant pin connectors for being connected to plated-through holes.

21. The mounting structure recited in claim 20, wherein the lead receivers comprise spaced arms having a tapered configuration that define between them a lead receiving space that tapers from wide-to-narrow from top-to-bottom.

22. The mounting structure recited in claim 20, wherein the cap further comprises:
one or more slots for receiving the electrical connectors, the slots being located in an end wall of the cap and extending generally parallel to the end wall; and
a lead opening associated with each lead of the capacitor, the lead openings extending through the end wall and intersecting an associated slot,
wherein the cap is configured so that the capacitor leads pass through the lead openings and engage the lead receivers in the slot when a lead end of the capacitor is installed in the cap.

* * * * *